(12) United States Patent
Pei et al.

(10) Patent No.: US 12,057,707 B2
(45) Date of Patent: Aug. 6, 2024

(54) WIRELESS CHARGING DEVICE

(71) Applicant: GUANGDONG OPPO MOBILE TELECOMMUNICATIONS CORP., LTD., Guangdong (CN)

(72) Inventors: Lin Pei, Guangdong (CN); Longping Yan, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 211 days.

(21) Appl. No.: 17/837,126

(22) Filed: Jun. 10, 2022

(65) Prior Publication Data

US 2022/0302757 A1   Sep. 22, 2022

Related U.S. Application Data

(63) Continuation of application No. PCT/CN2020/136175, filed on Dec. 14, 2020.

(30) Foreign Application Priority Data

Dec. 25, 2019 (CN) .......................... 201911358688.X

(51) Int. Cl.
*H05K 7/20* (2006.01)
*H02J 50/10* (2016.01)

(52) U.S. Cl.
CPC .......... *H02J 50/10* (2016.02); *H05K 7/20145* (2013.01); *H05K 7/20154* (2013.01); *H05K 7/20172* (2013.01); *H05K 7/20409* (2013.01)

(58) Field of Classification Search
CPC . H02J 50/10; H05K 7/20145; H05K 7/20154; H05K 7/20172; H05K 7/20409

(Continued)

(56) References Cited

U.S. PATENT DOCUMENTS 10,270,276 B2 *   4/2019   Kim ..................... H02J 7/00309
10,938,239 B2 *   3/2021   Kim ....................... H02J 50/80

(Continued)

FOREIGN PATENT DOCUMENTS

CN    208638058    3/2019
CN    109617152    4/2019

(Continued)

OTHER PUBLICATIONS

WIPO, International Search Report and Written Opinion for PCT/CN2020/136175, Mar. 11, 2021.

(Continued)

*Primary Examiner* — Anatoly Vortman
(74) *Attorney, Agent, or Firm* — Hodgson Russ LLP

(57) ABSTRACT

A wireless charging device includes a shell, a coil assembly, a main board assembly and a heat dissipation assembly. The shell is defined with first and second air ports, the coil assembly and the main board assembly are located in the shell, the heat dissipation assembly is used for dissipating heat of the coil assembly and the main board assembly. The heat dissipation assembly includes a heat sink and a fan, the heat sink includes a first side and a second side facing away from each other, the coil assembly is arranged on the first side, the fan is arranged on the second side, and the fan is defined with third and fourth air ports. The first air port, the second air port, the third air port and the fourth air port are in communication with one another to form a heat-dissipation air passage located on the second side.

20 Claims, 9 Drawing Sheets

(58) Field of Classification Search
USPC .......................................................... 361/690
See application file for complete search history.

(56) References Cited

U.S. PATENT DOCUMENTS

| | | | |
|---|---|---|---|
| 11,419,238 B2* | 8/2022 | Sui | H01F 27/085 |
| 11,476,706 B2* | 10/2022 | Pinkos | H02J 50/005 |
| 11,482,870 B2* | 10/2022 | Selby | H02J 7/00309 |
| 11,778,772 B2* | 10/2023 | Sui | H02J 50/005 |
| | | | 361/695 |
| 2010/0277121 A1* | 11/2010 | Hall | H02J 50/90 |
| | | | 320/108 |
| 2011/0074346 A1* | 3/2011 | Hall | H02J 50/80 |
| | | | 320/108 |
| 2013/0107136 A1* | 5/2013 | Tamura | H04N 5/64 |
| | | | 348/836 |
| 2013/0154553 A1* | 6/2013 | Steele | B60M 7/003 |
| | | | 320/108 |
| 2014/0007594 A1* | 1/2014 | Lofy | H05K 7/20209 |
| | | | 62/3.2 |
| 2017/0047769 A1 | 2/2017 | Kim et al. | |
| 2019/0355509 A1 | 11/2019 | Yio et al. | |
| 2020/0021125 A1* | 1/2020 | Thiel | H02J 7/0044 |
| 2020/0280212 A1* | 9/2020 | Kim | H02J 50/005 |
| 2021/0185854 A1* | 6/2021 | Sui | H02J 50/005 |

FOREIGN PATENT DOCUMENTS

| | | |
|---|---|---|
| CN | 109729689 | 5/2019 |
| CN | 209233498 | 8/2019 |
| CN | 209627022 | 11/2019 |
| CN | 209730870 | 12/2019 |
| DE | 102016216900 B3 | 10/2017 |
| EP | 3509075 A2 | 7/2019 |
| KR | 101879656 B1 | 7/2018 |
| KR | 20180128287 | 12/2018 |

OTHER PUBLICATIONS

EPO, Search Report for EP Application No. 20905402.2, Nov. 7, 2022.
CNIPA, First Office Action for CN Application No. 201911358688.X, Sep. 29, 2023.

* cited by examiner

WIRELESS CHARGING DEVICE

CROSS REFERENCE OF RELATED APPLICATIONS

This application is a continuation of International Patent Application No. PCT/CN2020/136175, filed Dec. 14, 2020, which claims priority to Chinese Patent Application No. 201911358688.X, filed Dec. 25, 2019, the entire disclosures of which are incorporated herein by reference.

TECHNICAL FIELD

The present disclosure relates to the field of power charging technologies, and more particularly to a wireless charging device.

BACKGROUND

A traditional wireless charging device has poor heat-dissipation performance, and during charging a device to be charged, a temperature of the wireless charging device rises rapidly and the heat-dissipation efficiency is relatively low.

SUMMARY

In view of the above, the present disclosure proposes a wireless charging device described hereafter, to alleviate the above defects.

Specifically, in some embodiments, the wireless charging device may include: a shell, defined with a first air port and a second air port; a coil assembly and a main board assembly, disposed in the shell; and a heat dissipation assembly, configured (i.e., structured and arranged) to dissipate heat generated from the coil assembly and the main board assembly.

The heat dissipation assembly may include a heat sink and a fan. The heat sink may include a first side and a second side facing away from each other. The coil assembly may be arranged on the first side, and the fan may be arranged on the second side. The fan may be defined with a third air port and a fourth air port. The first air port, the second air port, the third air port and the fourth air port are in communication with one another to form a heat-dissipation air passage on the second side of the heat sink.

In some other embodiments, the wireless charging device may include: a shell, defined with a first air port and a second air port; a coil assembly and a main board assembly, arranged in the shell; the coil assembly and the main board assembly being electrically connected with each other; and a heat dissipation assembly, arranged in the shell and including a heat sink and a fan.

The coil assembly and the main board assembly may be arranged at a same side of the heat sink. The fan may be arranged on a side of the heat sink facing away from the coil assembly and electrically connected to the main board assembly. The side of the heat sink facing away from the coil assembly and the shell may together define a passage therebetween. The first air port is in communication with the second air port through the fan and the passage sequentially.

In some other embodiments, the wireless charging device may include: a shell, having a support surface for placing a device to be charged, a side of the shell facing away form the support surface being defined with a first air port and a second air port; a coil assembly and a main board assembly, disposed in the shell; the coil assembly and the main board assembly being electrically connected; and a heat dissipation assembly, disposed in the shell and including a heat sink and a fan.

The coil assembly and the main board assembly may be arranged a side of the heat sink facing towards the support surface. The coil assembly and the main board assembly may be thermally connected to the heat sink. The fan may be arranged on a side of the heat sink facing away from the coil assembly and electrically connected to the main board assembly. The side of the heat sink facing away from the coil assembly and the shell may cooperatively define a passage therebetween. The first air port is in communication with the second air port through the fan and the passage sequentially.

BRIEF DESCRIPTION OF THE DRAWINGS

In order to describe technical solutions in embodiments of the present disclosure or in the related art more clearly, drawings used in the description of the embodiments or the related art will be briefly introduced below. Apparently, the drawings in the following description are only some embodiments of the present disclosure. For those skilled in the art, drawings of other embodiments can be obtained according to these drawings without paying creative labor.

FIG. 5 illustrates a schematic perspective view of the first casing of the wireless charging device illustrated in FIG. 4a.

FIG. 8 illustrates a schematic perspective view of a heat dissipation assembly of the wireless charging device illustrated in FIG. 4a.

FIG. 9 illustrates a schematic perspective view of the heat dissipation assembly and the electronic assembly in an assembled state of the wireless charging device illustrated in FIG. 4a.

FIG. 10 illustrates a schematic perspective view of a fan and an air guide hood of the wireless charging device illustrated in FIG. 4a.

DETAILED DESCRIPTION OF EMBODIMENTS

In order to facilitate the understanding of the present disclosure, the present disclosure will be described more comprehensively below with reference to the accompanying drawings. Preferred embodiments of the present disclosure are given in the accompanying drawings. However, the present disclosure can be implemented in many different forms and is not limited to the embodiments described herein. Rather, these embodiments are provided for the purpose of enabling more thorough and comprehensive understanding of the disclosed content of the present disclosure.

Figure 1:
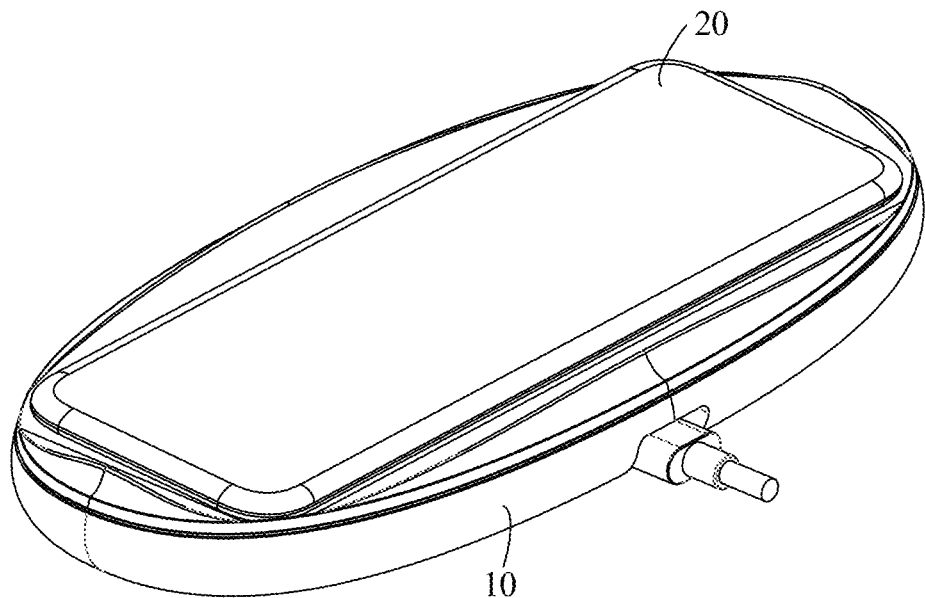
FIG. 1 illustrates a schematic side view of a wireless charging device according to an embodiment, and a device to be charged being disposed on the wireless charging device.

As illustrated in FIG. 1, in an embodiment, a wireless charging device 10 is provided. The wireless charging device 10 is capable of charging a device 20 to be charged.

Figure 2:
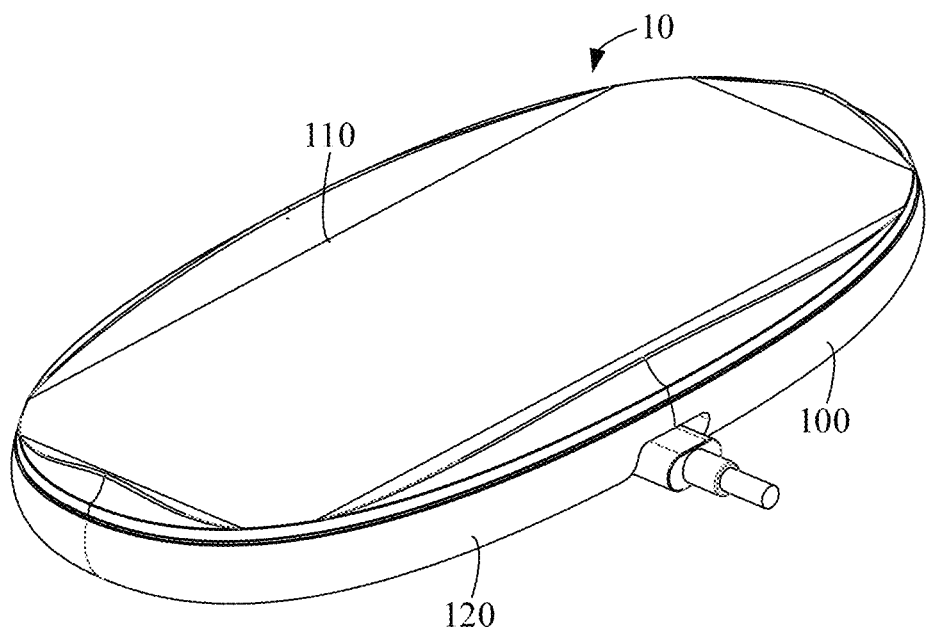
FIG. 2 illustrates a schematic perspective view of the wireless charging device illustrated in FIG. 1.

As illustrated in FIG. 2, in an embodiment, the wireless charging device 10 includes a shell 100. The shell 100 includes a first casing 120 and a second casing 110. The first casing 120 and the second casing 110 are assembled together to form an external structure of the wireless charging device 10. When the wireless charging device 10 is used to charge the device 20 to be charged, the device 20 to be charged is needed to be disposed on the second casing 110.

Figure 3:
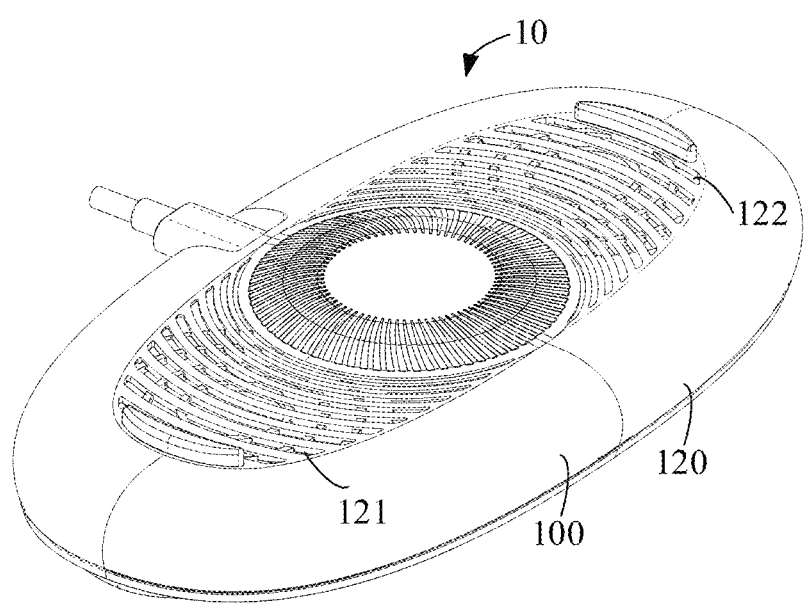
FIG. 3 illustrates another schematic perspective view of the wireless charging device illustrated in FIG. 1.

As illustrated in FIG. 3, in an embodiment, a first air port 121 and a second air port 122 are defined on the first casing 120. An external air flow can enter the shell 100 through one of the first air port 121 and the second air port 122, and flow out of the shell 100 from the other of the first air port 121 and the second air port 122, so that heat in the shell 100 can be taken away by the external air flow, thereby reducing the temperature of the wireless charging device 10.

Figure 4A:
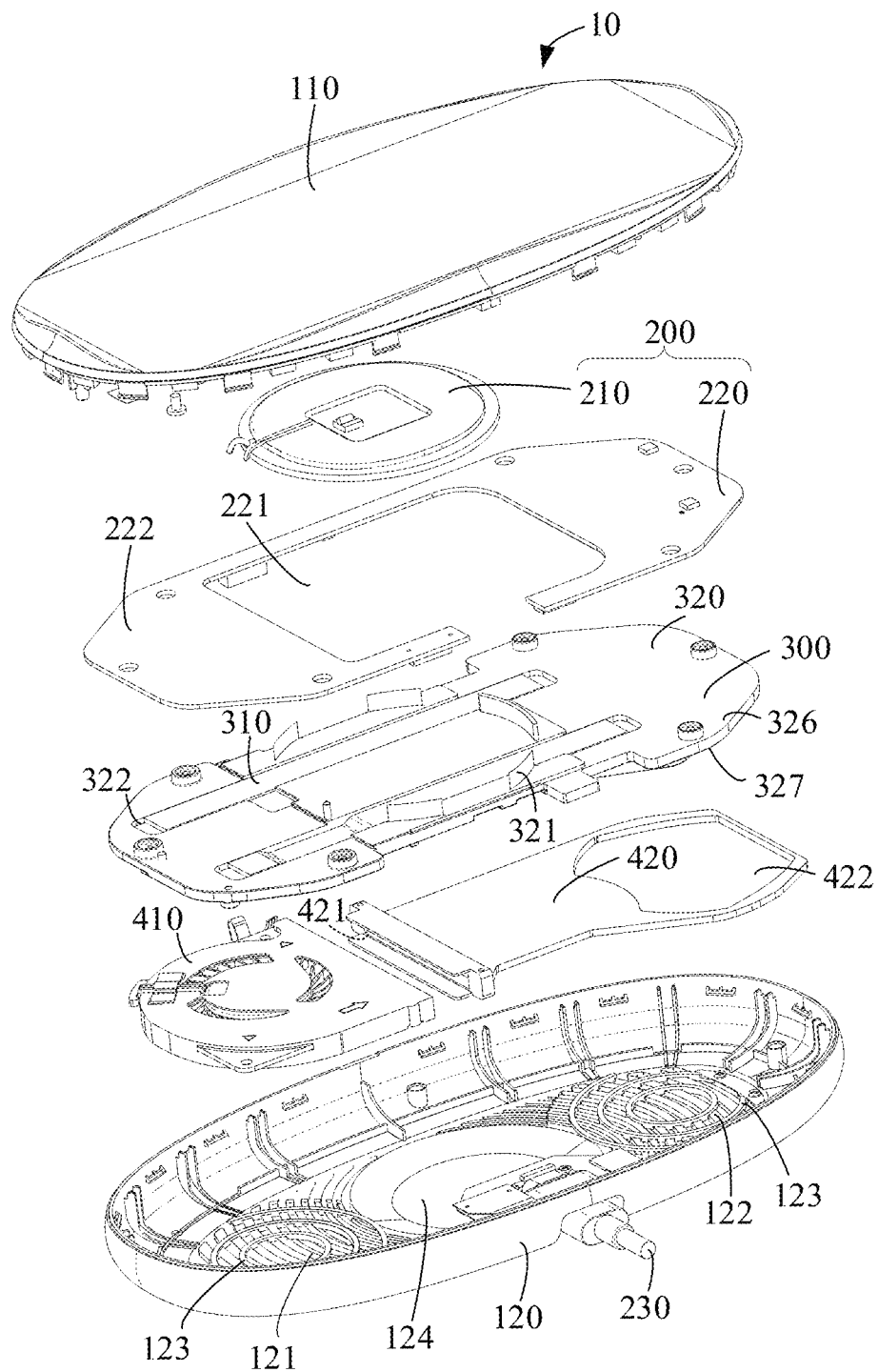
FIG. 4a illustrates a schematic exploded view of the wireless charging device illustrated in FIG. 1.

As illustrated in FIG. 4a, in an embodiment, the wireless charging device includes an electronic assembly 200 and a heat dissipation assembly 300 sequentially arranged in the shell 200. The electronic assembly 200 is capable of charging the device 20 to be charged, and the electronic device 200 would generate heat during charging the device 20 to be charged. By setting the heat dissipation assembly 300, the heat generated by the electronic assembly 200 would be transferred and dissipated to external environment.

In an embodiment, the electronic assembly 200 includes a coil assembly 210 and a main board assembly 220. The heat dissipation assembly 300 includes a heat-conducting element 310, a heat sink 320, a fan 410, and air guide hood 420. The heat sink 320 includes a first side 326 and a second side 327 facing away from each other. The coil assembly 210, the main board assembly 220 and the heat-conducting element 310 are fixed on the first side 326; and the fan 410 and the air guide hood 420 are fixed on the second side 327. Heat generated from the coil assembly 210 and the main board assembly 220 can be delivered to the heat-conducting element 310 and the heat sink 320, and heat of the heat-conducting element 310 can be delivered to the heat sink 320. The air guide hood 420 and the second side 327 have a spacing formed therebetween. The first air port 121 and the second air port 122 are located at a side of the fan 410 facing away from the second side 327.

In an embodiment, the fan 410 is a centrifugal fan.

Figure 4B:
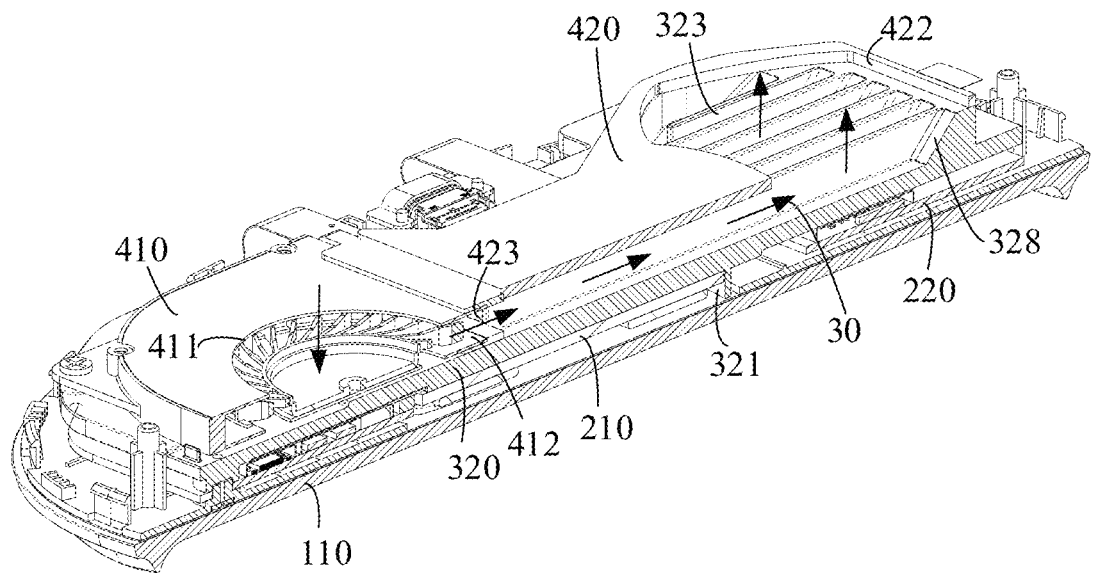
FIG. 4b illustrates a schematic cross-sectional view of the wireless charging device illustrated in FIG. 1 at an observation angle, in which a first casing is removed.
Figure 4C:
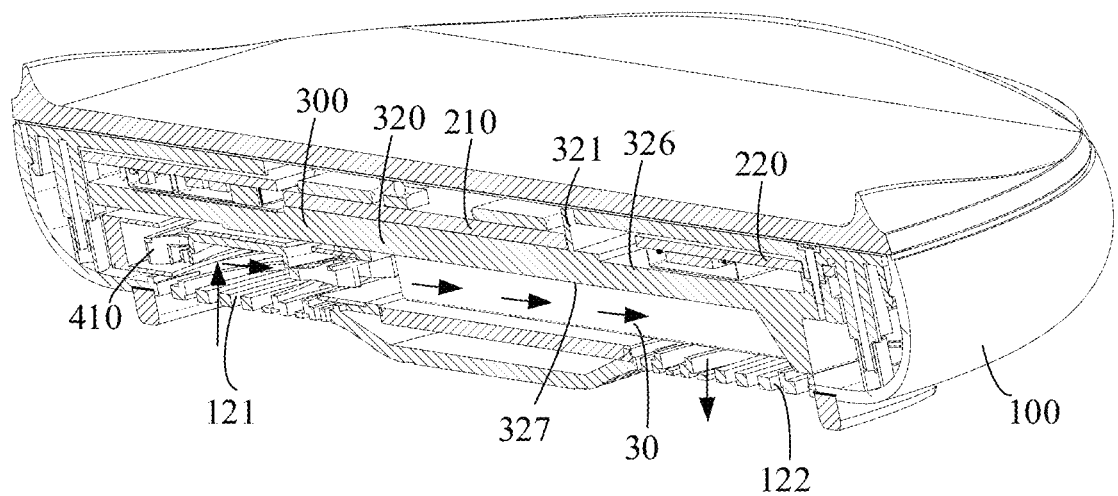
FIG. 4c illustrates a schematic cross-sectional view of the wireless charging device illustrated in FIG. 1 at another observation angle.
Figure 4D:
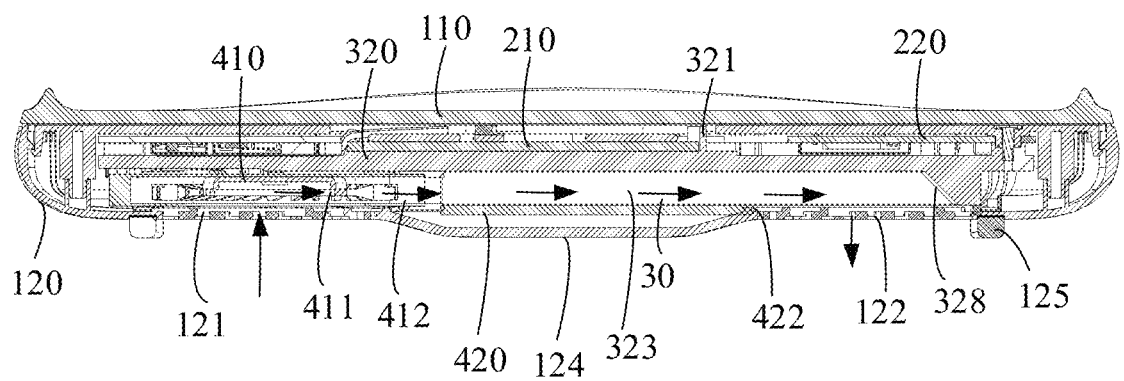
FIG. 4d illustrates a schematic cross-sectional view of the wireless charging device illustrated in FIG. 1 at still another observation angle.

As illustrated in FIG. 4a and FIG. 4d, in an embodiment, the fan 410 is defined with a third air port 411 and a fourth air port 412. The third air port 411 is an air inlet of the fan 410, and the fourth air port 412 is an air outlet of the fan 410. The third air port 411 is in communication with the first air port 121, and the fourth air port 412 is in communication with the second air port 122.

As illustrated in FIG. 4b through FIG. 4d, in an embodiment, when the fan 410 is working, an air flow in external environment can enter the shell 100 through the first air port 121, flow through the fan 410 and the spacing between the air guide hood 420 and the second side 327, and finally exhaust outside the shell 100 through the second air port 122, thereby carrying away heat of the heat sink 320 and facilitating heat inside the wireless charging device 10 to be transferred outside the shell 100. The first air port 121, the second air port 122, the third air port 411 and the fourth air port 412 together define a heat-dissipation air passage 30 at the second side 327 of the heat sink 320, so that the air flow flowing through the heat-dissipation air passage 30 flows through the second side 327 of the heat sink 320 and takes away the heat of the heat sink 320.

In another embodiment, the placement position of the fan 410 can be changed to thereby change a flow direction of the air flow. For example, when the fan 410 is working, an external air flow enters inside of the fan 410 from the second air port 122, then flows through the second side 327 of the heat sink 320, takes away the heat of the heat sink 320 and flows towards the first air port 121, and finally flows out of the shell 100 to take away heat inside the shell 100.

As illustrated in FIG. 4a, in an embodiment, the first casing 120 is a frame structure with an opening at one side, and the second casing 110 covers the opening of the first casing 120, so that the shell 100 forms a structure with an accommodating space. The electronic assembly 200, the heat sink 320, the fan 410 and the air guide hood 420 all are arranged in the accommodating space. In a direction from the second casing 110 to the first casing 120, the electronic assembly 200, the heat sink 320 and the fan 410 are sequentially arranged in that order, the air guide hood 420 and the fan 410 both are fixed on the second side 327 of the heat sink 320, and the coil assembly 210 and the main board assembly 220 both are fixed on the first side 326 of the heat sink 320. In an embodiment, the shell 100 is an oval structure; and in other embodiments, the shell 100 can be a square or polygonal structure, and it is not specifically limited herein.

Figure 5:
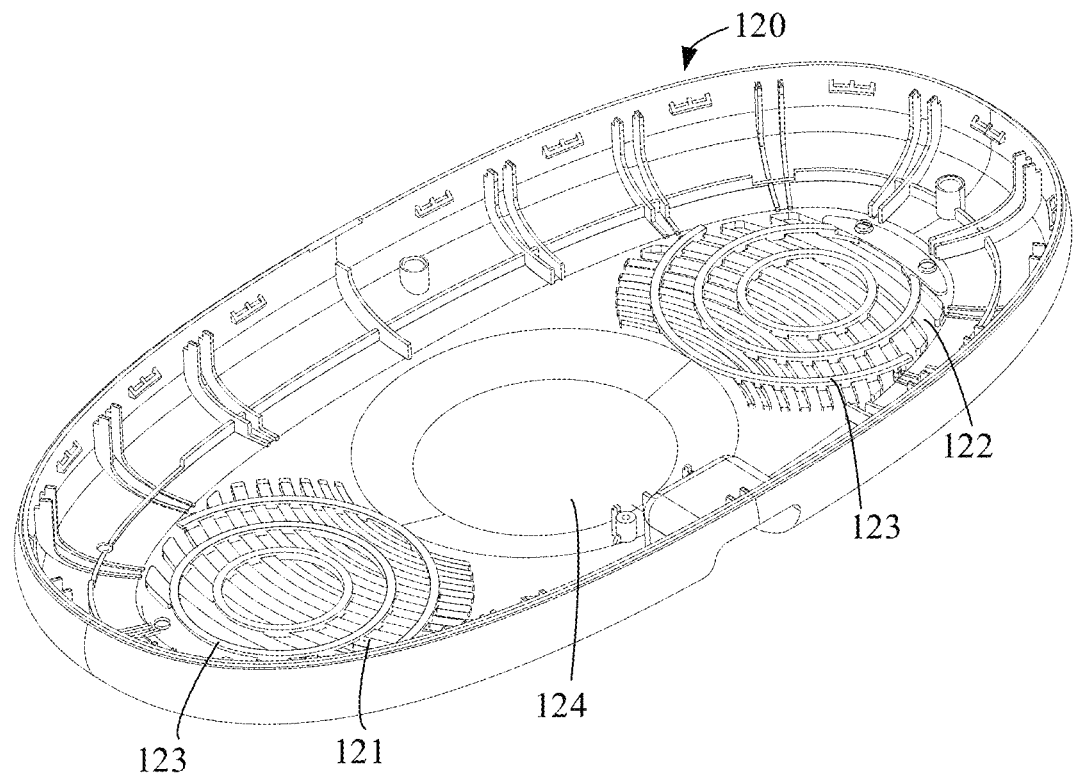

As illustrated in FIG. 5, in an embodiment, the first air port 121 and the second air port 122 are defined on a bottom wall of the first casing 120. The first air port 121 and the second air port 122 are respectively located on two ends in a lengthwise direction of the bottom wall of the first casing 120, and do not extend to two ends in a widthwise direction of the bottom wall of the first casing 120, i.e., the two ends in the widthwise direction of the bottom wall of the first casing 120 are closed structures, so as to avoid the first air port 121 and the second air port 122 are directly connected with each other. In an embodiment, the first air port 121 is a curved structure and is multiple (i.e., more than one) in quantity, so that portions of the bottom wall at the multiple first air ports 121 are curved strip structures and arranged at intervals with the multiple first air ports 121. The second air port 122 is a curved structure and is multiple in quantity, so that portions of the bottom wall at the multiple second air ports 122 are curved strip structures and arranged at intervals with the multiple second air ports 122.

As illustrated in FIG. 5, in an embodiment, the wireless charging device 10 includes reinforcement ribs 123. The reinforcement ribs 123 are ring-shaped structures and disposed on an inner surface of the bottom wall of the first casing 120, and are located at the positions of the first air ports 121 and the second air ports 122. The reinforcement ribs 123 are arranged crossing with the bottom wall with the curved strip structures of the first casing 120 at the first air ports 121 and the second air ports 122, which can enhance the strength of the first casing 120 at the first air ports 121 and the second air ports 122 and avoid fracture of the first casing 120 at the first air ports 121 or the second air ports 122 upon slight impact.

Figure 6:
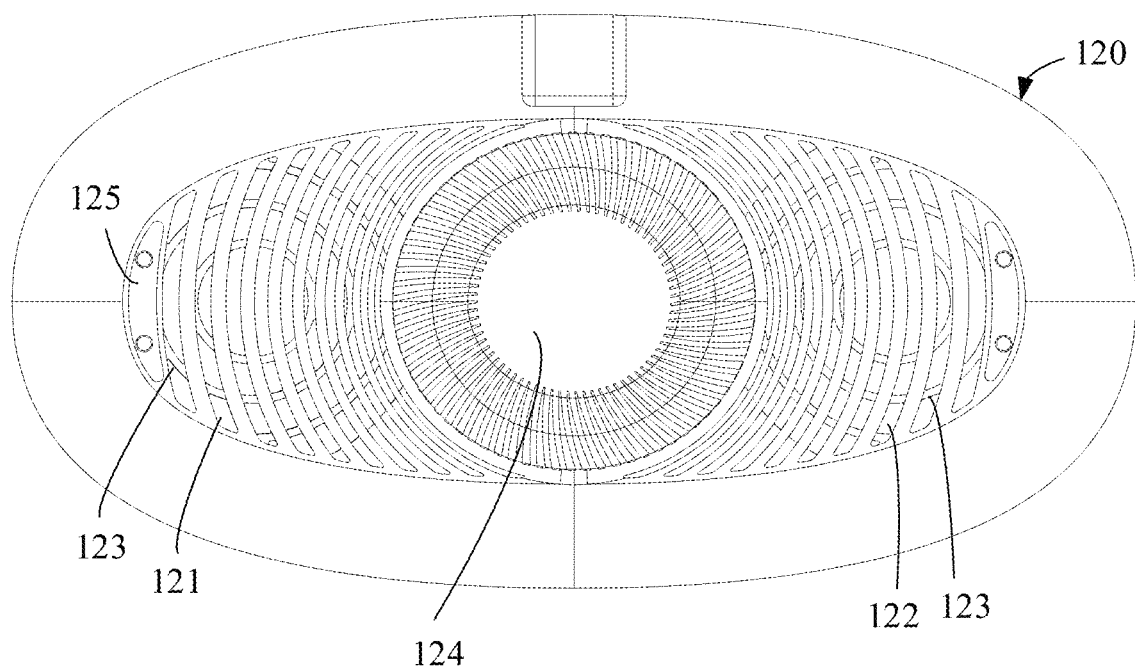
FIG. 6 illustrates a schematic bottom view of the first casing illustrated in FIG. 5.

As illustrated in FIG. 6, in an embodiment, an outer surface of the first casing 120 is disposed with support legs 125, and the support legs 125 are two in quantity. The two support legs 125 are respectively located at two ends in a lengthwise direction of the first casing 120. It can be understood that, one support leg 125 is located at a side of the first air port 121 facing away from the second air port 122, and the other support leg 125 is located at a side of the second air port 122 facing away from the first air port 121. The support legs 125 are located outside of regions where the first air port 121 and the second air port 122 are located, so as to prevent the support legs 125 from blocking the flowing of an air flow at the first air port 121 or the second air port 122.

In an embodiment, an air-blocking plate 124 is arranged between the first air port 121 and the second air port 122, to prevent an air flow with relatively high temperature flowing out of the second air port 122 from flowing into the first air port 121 again and causing the heat dissipation effect to decrease. In an embodiment, the air-blocking plate 124 is a flat plate structure protruding from the outer surface of the first casing 120 and located between the first air port 121 and the second air port 122. A height of the air-blocking plate 124 is the same as a height of the support legs 125, so that the air-blocking plate 124 can completely isolate the air flow between the first air port 121 and the second air port 122 when the wireless charging device 10 is placed on a horizontal plane, and thereby prevent the air flow of the second air port 122 from flowing into the first air port 121.

In another embodiment, as illustrated in FIG. 6, the air-blocking plate 124 a disc-shaped structure located between the first air port 121 and the second air port 122, and protrudes from the outer surface of the first casing 120. A height of the air-blocking plate 124 protruding from the outer surface of the first casing 120 is the same as the height of the support legs 125, so that the disc-shaped air-blocking plate 124 can completely isolate the air flow between the first air port 121 and the second air port 122 when the wireless charging device 10 is placed on a horizontal plane, and thereby prevent the air flow of the second air port 122 from flowing into the first air port 121. The disc-shaped air-blocking plate 124 is more beautiful and integrally formed with the first casing 120, which can increase the strength of the first casing 120 and achieve the purpose of preventing the air flow of the second air port 122 from flowing into the first air port 121.

Figure 7:
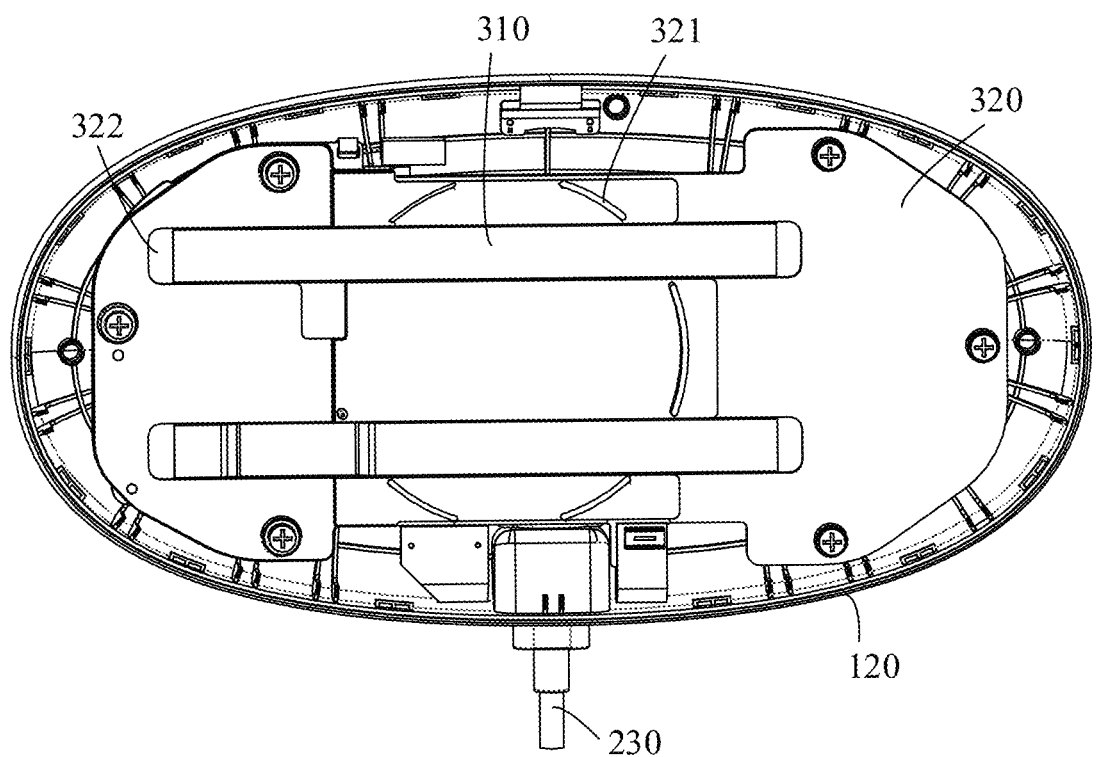
FIG. 7 illustrates a schematic top view of the wireless charging device illustrated in FIG. 2, in which a second casing and an electronic assembly are removed.

As illustrated in FIG. 7, in an embodiment, the wireless charging device 10 is disposed with an electrical cable 230. The electrical cable 230 penetrates through the first casing 120 and is electrically connected to the coil assembly 210 and the main board assembly 220, so as to make the wireless charging device 10 be electrically connected to an external power source. The heat sink 320 covers most of the area of the first casing 120, and a size of the first casing 120 is slightly larger than a size of the heat sink 320, allowing the space inside the wireless charging device 10 to be used efficiently.

Figure 8:
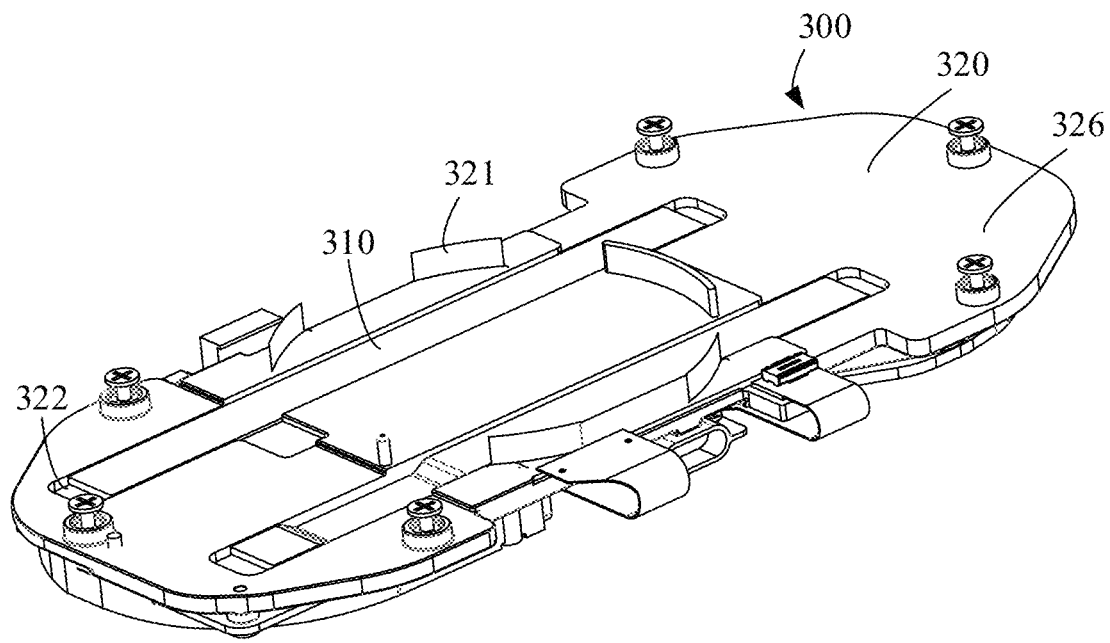

As illustrated in FIG. 8, in an embodiment, the first side 326 of the heat sink 320 is defined with recesses 322, and the heat-conducting element 310 is fixed in the recesses 322. A surface of the heat-conducting element 310 is flush with a surface of the heat sink 320. It can be understood that, the surface of the heat-conducting element 310 being slightly higher than the surface of the heat sink 320 or slightly lower than the surface of the heat sink 320 should belong to the range of being flush with.

Figure 9:
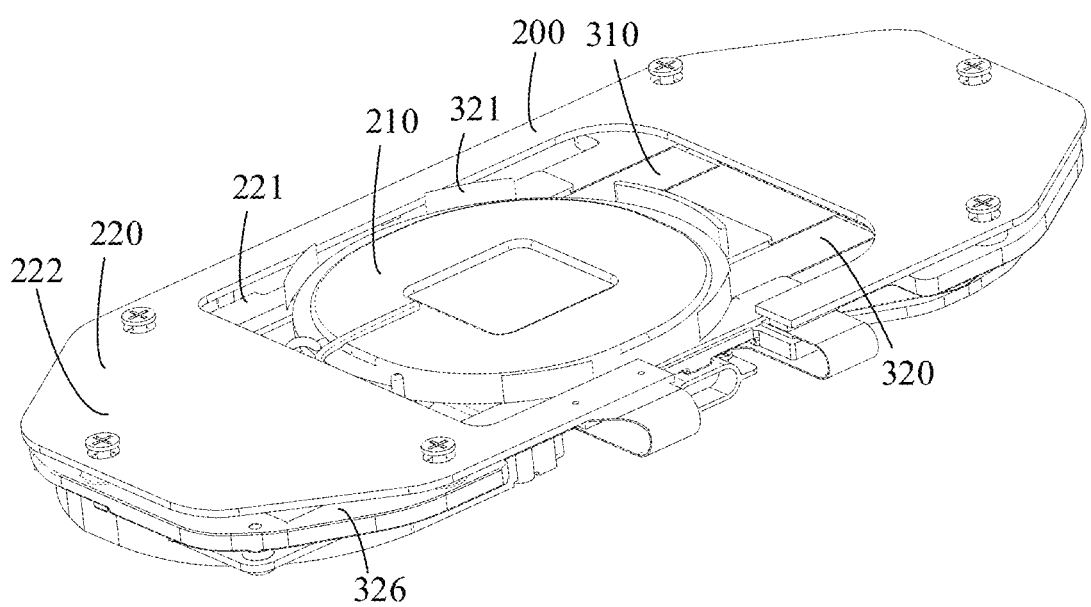

As illustrated in FIG. 9, in an embodiment, the heat-conducting element 310 is a heat pipe, one end thereof can absorb heat, and the other end thereof can release heat. That is, a part of structure of the heat-conducting element 310 can absorb heat, and the other structure of the heat-conducting element 310 can release heat. The coil assembly 210 is attached to a heat-absorbing part of the heat-conducting element 310, and the heat-conducting element 310 can absorb heat of the coil assembly 210 and transfer the heat to a heat-releasing end of the heat-conducting element 310 to complete the heat transfer, so that a temperature of the coil assembly 210 can be reduced. The main board assembly 220 includes a heat source region 222, and electronic components of the main board assembly 220 that generate a lot of heat are mainly located in the heat source region 222. When the main board assembly 220 is working, the heat source region 222 generates more heat due to the presence of the heat-generating electronic components, resulting in a relatively fast rise in temperature. The heat source region 222 of the main board assembly 220 is attached to a heat-absorbing end of the heat-conducting element 310, the heat-conducting element 310 can absorb heat of the heat source region 222 and transfer the heat to the heat-releasing end of the heat-conducting element 310 to complete the heat transfer, so that a temperature of the heat source region 222 of the main board assembly 220 can be reduced and a temperature of the main board assembly 220 can be reduced consequently.

In an embodiment, the heat source region 222 and the fan 410 are arranged facing away from each other on the heat sink 320. When setting an external air flow to flow into the shell 100 from the first air port 121 and flow out of the shell 100 from the second air port 122, the placement position of the fan 410 is shown in FIG. 4b, so that the air flow enters the third air port 411 from the first air port 121, flows out of the fan 410 from the fourth air port 412 and flows towards the second air port 122. When setting the external air flow to enter the shell 100 from the second air port 122 and flow out of the shell 100 from the first air port 121, the fan 410 is positioned upright with respect to the heat sink 320, so that the third air port 411 faces towards the air guide hood 420, the fourth air port 412 faces towards the first air port 121. The air flow enters inside the shell 100 from the second air port 122 and enters in the fan 410 through the third air port 411, and afterwards flows out of the fan 410 through the fourth air port 412, flows towards the first air port 121 and then flows out of the shell 100.

As illustrated in FIG. 8, in an embodiment, the heat-conducting element 310 is two in quantity, and the two heat-conducting elements 310 each are arranged along the lengthwise direction of the heat sink 320, so that the heat-absorbing parts of the heat-conducting elements 310 are located on one end of the heat sink 320, and the heat-releasing parts of the heat-conducting elements 310 are located on the other end of the heat sink 320. In the widthwise direction of the heat sink 320, the two heat-conducting elements 310 are evenly distributed, so that heat of the coil assembly 210 and the main board assembly 220 can be evenly absorbed. When the temperature of the heat-conducting elements 310 is higher than that of the heat sink 320, the heat-conducting elements 310 can transfer the heat to the heat sink 320. The air flow flowing through the heat sink 320 can take away the heat of the heat sink 320, and thereby carry away the heat generated from the coil assembly 210 and the main board assembly 220.

In another embodiment, the heat-conducting element 310 is one or more than two in quantity, and it is not specifically limited herein.

In an embodiment, the heat-conducting element 310 is a structure such as a vapor chamber or a graphite sheet, and it is not specifically limited herein. The heat-conducting element 310 may have high thermal conductivity.

As illustrated in FIG. 8, in an embodiment, a material of the heat sink 320 is metal, so that the heat sink 320 may have good heat transfer and heat-dissipation effects.

As illustrated in FIG. 9, in an embodiment, a part of structure of the coil assembly 210 is attached to the heat-conducting element 310, so that the heat-conducting element 310 can absorb heat of the coil assembly 210 and tends to evenly distribute the heat on the heat-conducting element 310. The other structure of the coil assembly 210 is attached to the heat sink 320, so that the heat sink 320 can absorb heat of the coil assembly 210 and tends to evenly distribute the heat on the heat sink 320. After the heat sink 320 absorb the heat of the coil assembly 210, most of the heat is dissipated through the heat-dissipation air passage 30, and some of the heat is able to be dissipated through the heat sink 320 itself. It can be understood that a primary heat-dissipation path for the coil assembly 210 is the heat-conducting element 310, and a secondary heat-dissipation path is the heat sink 320.

As illustrated in FIG. 9, in an embodiment, the contour shape and size of the main board assembly 220 are the same as or similar to the contour shape and size of the heat sink 320, and the main board assembly 220 is disposed on the first side 326 of the heat sink 320. The heat source region 222 of the main board assembly 220 is attached to the heat-absorbing end of the heat-conducting element 310, so that the heat generated by the heat source region 222 can be absorbed by the heat-conducting element 310, and the heat then is transferred on the heat-conducting element 310 until it is evenly distributed on the heat-conducting element 310. It can be understood that, when the heat-conducting element 310 is a heat pipe, the heat-conducting element 310 does not completely cover the heat sink 320, a part of structure of the heat source region 222 of the main board assembly 220 is attached to the heat sink 320, so that heat generated from the heat source region 222 can be transferred through the heat sink 320 to evenly distributed in the heat sink 320. After the heat sink 320 absorbs the heat of the main board assembly 220, most of the heat can be dissipated through the heat-dissipation air passage 30, and some of the heat is dissipated through the heat sink 320 itself.

As illustrated in FIG. 8, in an embodiment, a surface of the heat sink 320 facing towards the coil assembly 210 is provided with convex-ring segments 321 protruding from the heat sink 320, the convex-ring segments 321 are multiple in quantity and spaced from one another to avoid interference between the convex-ring segments 321 and the heat-conducting element 310 arranged along the lengthwise direction of the heat sink 320.

As illustrated in FIG. 9, the multiple convex-ring segments 321 are arranged to form a circular area, and the coil assembly 210 can be accommodated in the circular area, so that the coil assembly 210 is fixed to the heat sink 320. In another embodiment, depending on the shape of the coil assembly 210, the area surrounded by the convex-ring segments 321 is different, and for example, when the coil assembly 210 is square in shape, the area surrounded by the convex-ring segments 321 is square in shape correspondingly.

As illustrated in FIG. 9, in an embodiment, the main board assembly 220 is fixed to the first side 326 of the heat sink 320 through screws or bolts. An opening 221 is defined on the main board assembly 220. The coil assembly 210 and the convex-ring segments 321 are arranged in the opening 221, and the coil assembly 210 is electrically connected to the main board assembly 220, so as to avoid interference between the coil assembly 210 and the main board assembly 220 in a thickness direction of the wireless charging device 10, and further avoid a superposition of the coil assembly 210 and the main board assembly 220 in the thickness direction to thereby reduce the thickness of the wireless charging device 10. It can be understood that a part of the heat-conducting element 310 in contact with the coil assembly 210 can absorb heat, so that heat of the coil assembly 210 can be absorbed and transferred by the heat-conducting element 310.

Figure 10:
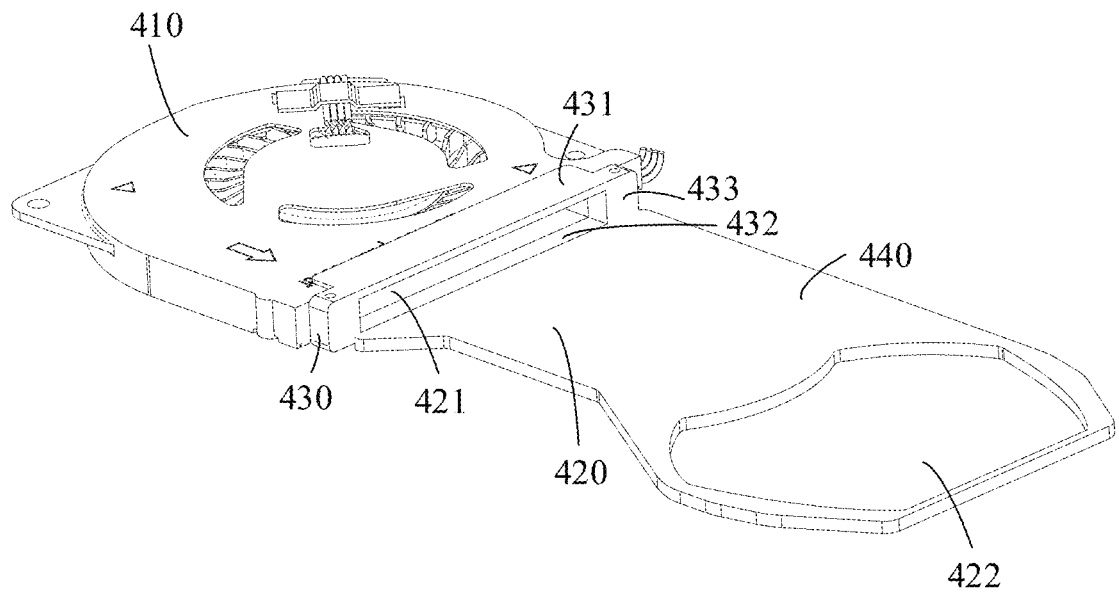
Figure 11:
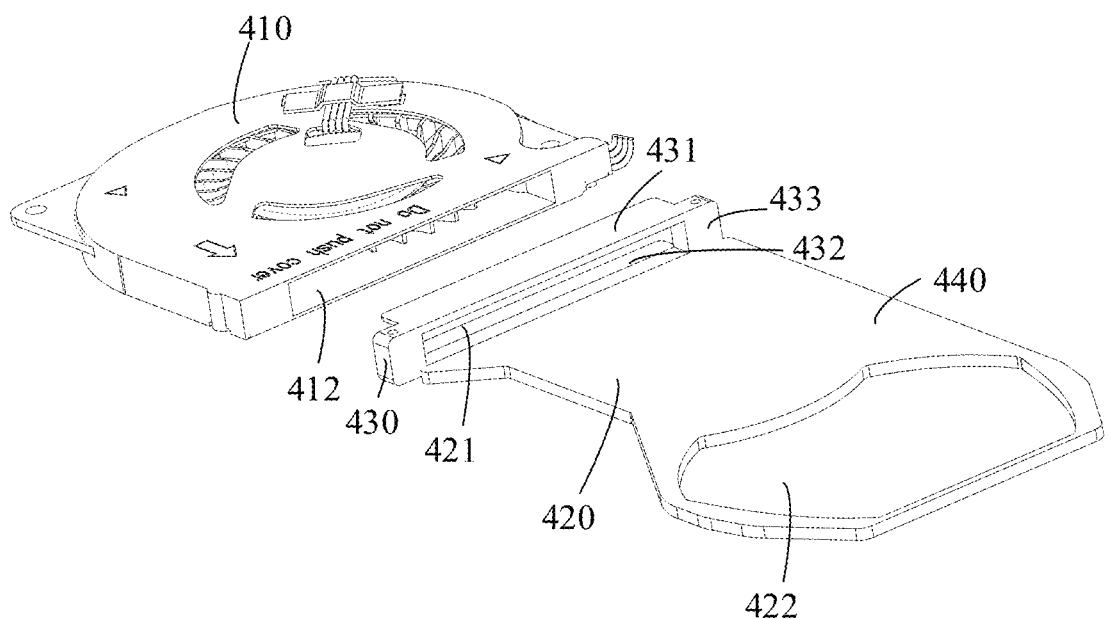
FIG. 11 illustrates a schematic perspective view of the fan and the air guide hood illustrated in FIG. 10 in a separated state.

As illustrated in FIG. 10 and FIG. 11, in an embodiment, the air guide hood 420 includes a connecting member 430 and an air guide plate 440. One end of the connecting member 430 is connected to the fan 410, and the other end of the connecting member 430 is connected to the air guide plate 440. More specifically, the connecting member 430 includes a top wall 431, a bottom wall 432, and two side walls 433. The top wall 431, the bottom wall 432 and the two side walls 433 together define a through slot 421. The top wall 431 and the bottom wall 432 are respectively snapped onto two opposite sides of the fan 410 to make the connecting member 430 be connected to the fan 410, and the through slot 421 is in communication with the fourth air port 412. The air guide plate 440 is connected to the other end of the connecting member 430, and further connected to the bottom wall 432. It can be understood that, the connecting member 430 can be snapped with the fan 410 and can be detachable from the fan 410. The end of the air guide plate 440 facing away from the connecting member 430 is defined with a vent 422, so that an air flow flowing out from the fourth air port 412 of the fan 410 can flow through the vent 422 and flow along a direction away from the second side 327. A shape of the vent 422 may be round, square, or polygonal, etc.

In an embodiment, the connecting member 430 and the air guide plate 440 are an integrally formed structure, i.e., one-piece structure.

Figure 12:
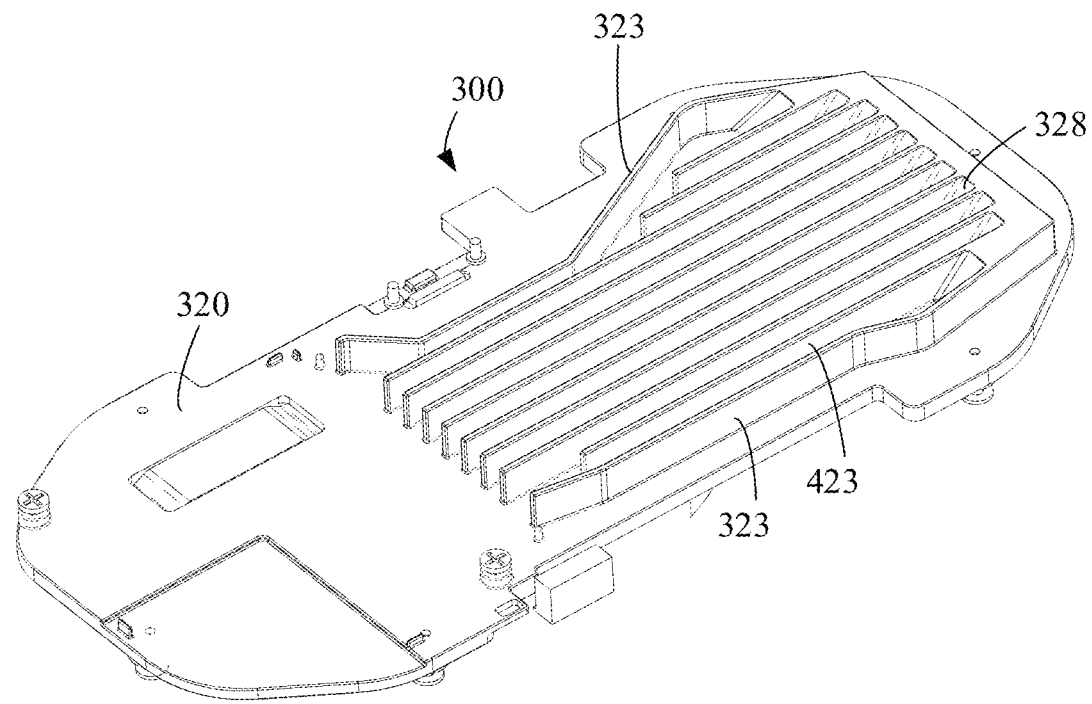
FIG. 12 illustrates a schematic perspective view of a heat sink and fins of the wireless charging device illustrated in FIG. 4a at another observation angle.
Figure 13:
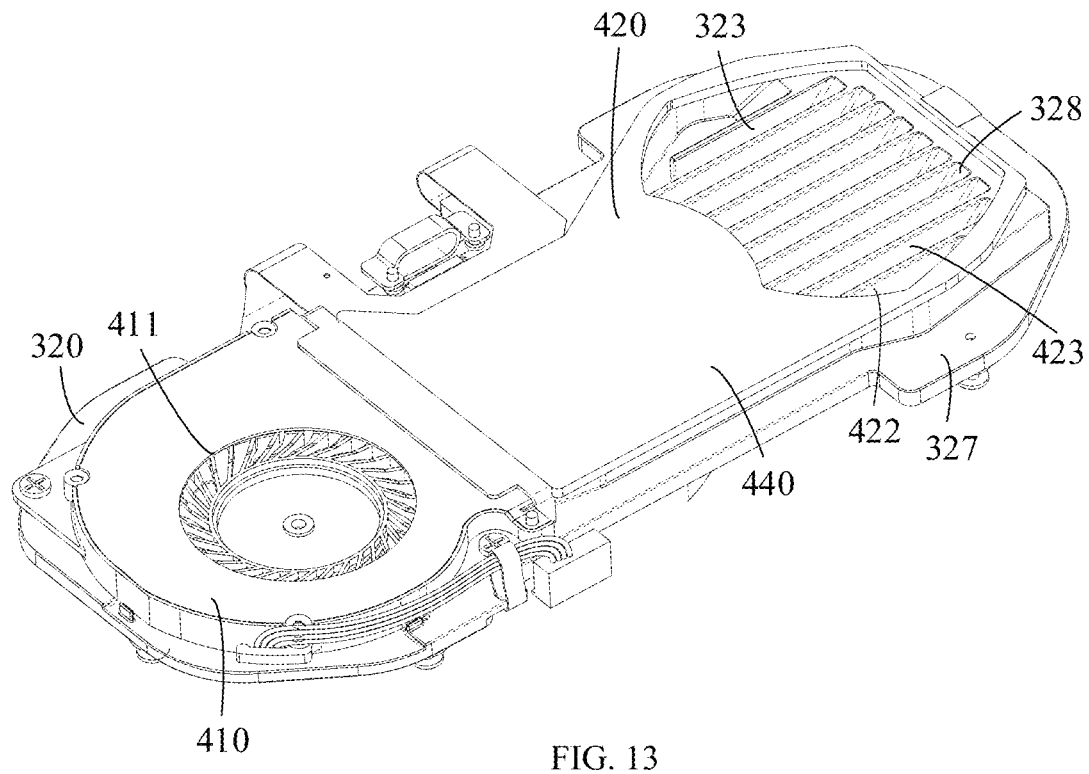
FIG. 13 illustrates a schematic perspective view of the heat dissipation assembly illustrated in FIG. 8 at another observation angle.

As illustrated in FIG. 12 and FIG. 13, in an embodiment, the heat dissipation assembly 300 includes at least two fins 323, which can be more than two fins 323. The fins 323 each are arranged along the lengthwise direction of the wireless charging device 10. The fins 323 are fixed onto the second side 327 of the heat sink 320, and the fins 323 are located between the second side 327 and the air guide plate 440, i.e., the air guide hood 420 covers the fins 323, and no air leakage between the air guide hood 420 and fins 323. Adjacent two of the fins 323 define an air guide groove 423 therebetween, and two ends of the air guide groove 423 are in communication with the through slot 421 and the vent 422 respectively. In an embodiment, the air guide groove 423 may be one in quantity. In another embodiment, the air guide groove may be multiple in quantity. An air flow flowing through the fan 410 can pass through the fourth air port 412 and the through slot 421 and flow towards the air guide groove 423, and then flow through the vent 422 and flow towards the second air port 122. When the air flow flowing through the air guide groove 423, it can take away heat of the heat sink 320.

The arrangement of the air guide hood 420 and the fins 323 can guide a flow direction of an air flow flowing through the fan 410, so that the air flow flowing through the fan 410 can flow through the second side 327 of the heat sink 320, to take away the heat of the heat sink 320. The air guide hood 420 and the fins 323 direct the air flow flowing through the heat sink 320 to the second air port 122 and thereby flow out of the shell 100. It can be understood that the arrangement of the air guide hood 420 and the fins 323 can avoid irregular flow of the air flow between the fourth air port 412 and the second air port 122 and the air flow being trapped within the shell 100.

In an embodiment, the fins 323 and the heat sink 320 are an integrally formed structure, i.e., one-piece structure.

As illustrated in FIG. 13, in an embodiment, the second side 327 of the heat sink 320 is disposed with an air guide wall 328 extending obliquely relative to the air guide plate 440. The air guide wall 328 is located on one end of the air guide groove 423 facing away from the through slot 421, and the air guide wall 328 forms a groove wall of the air guide groove 423. An end of the air guide wall 328 connected to the second side 327 is close to the fan 410, and the other end of the air guide wall 328 is facing away from the fan 410. The air guide wall 328 corresponds to the vent 422, and the vent 422 corresponds to the second air port 122. Since the air guide wall 328 is obliquely arranged, an air flow flowing through the air guide groove 423 is guided by the air guide wall 328 and flows towards the vent 422, and then flows towards the second air port 122, and such arrangement can reduce the resistance of the air flow.

As illustrated in FIG. 4c and FIG. 4d, in an embodiment, the vent 422 is located on an end of the heat sink 320 facing away from the fan 410, and corresponds to the second air port 122. An air flow flowing through the fan 410 enters the air guide groove 423 through the fourth air port 412 and the through slot 421, and flows along the air guide groove 423 to the air guide wall 328, and further is guided by the air guide wall 328 to flow towards the vent 422, thereby taking away heat of the heat sink 320. The air flow flows out of the air guide groove 423 through the vent 422, and exhausts outside the shell 100 through the second air port 122 to carry away heat in the shell 100. It can be understood that when the air flow with relatively low temperature flowing out of the fan 410 flows in the air guide groove 423, it can take away the heat of the heat sink 320 itself and thereby reduce the temperature of the heat sink 320.

In an embodiment, a material of the fins 323 is metal, so that the heat sink 320 may have good heat-dissipation performance. When an air flow flows through the air guide groove 423, the air flow can take away heat of the fins 323, so that the heat sink 320 can be cooled down. In another embodiment, the material of the fins 323 is a composite material of metal and plastic, which can make the temperature of fins 323 not easy to rise, thus avoiding the transfer of temperature to the shell 100, and the temperature of the shell 100 is relatively low when a user touches the shell 100, which makes the user have a better use experience.

In an embodiment, in a case of the wireless charging device 10 being equipped with the fan 410 with small power, the heat-dissipation effect of the wireless charging device 10 is not particularly strong, and thus an outer surface or an inner surface of the second casing 110 can be attached with a heat storage material. The heat storage material can absorb heat of the wireless charging device 10, so that the temperature of the wireless charging device 10 rises more slowly, which can avoid transferring heat to the device 20 to be charged. The outer surface or the inner surface of the second casing 110 can be attached with a heat insulation material, which can block the transfer of heat and avoid transferring heat from the wireless charging device 10 to the device 20 to be charged.

In another embodiment, in a case of the wireless charging device 10 being equipped with the fan 410 with large power, the wireless charging device 10 has good heat-dissipation effect, and the outer surface or the inner surface of the second casing 110 can be attached with a high-efficient thermally conductive material. The high-efficient thermally conductive material can transfer heat faster. Due to the good heat-dissipation effect of the wireless charging device 10, the temperature of the wireless charging device 10 is relatively low and the temperature of the device 20 to be charged may increase and thus be higher than that of the wireless charging device 10. The heat of the device 20 to be charged can be transferred to the wireless charging device 10 through the high-efficient thermally conductive material, and thereby the heat can be well discharged into the environment through the heat-dissipation air passage 30 of the wireless charging device 10.

For the wireless charging device 10 according to the present disclosure, the heat sink 320 is disposed with the heat-conducting element 310 thereon, the coil assembly 210 and the main board assembly 220 both are attached to the heat-conducting element 310, so that heat generated from the coil assembly 210 and the main board assembly 220 can be absorbed through the heat-conducting element 310 and transferred by the heat-conducting element 310, and thereby the heat-conducting element 310 tends to evenly distribute the heat, allowing the coil assembly 210 and the main board assembly 220 to be cooled down. The coil assembly 210 and the main board assembly 220 are attached to the heat sink 320 made of metal, heat transfer and heat-dissipation effects of the heat sink 320 are good, so that heat of the coil assembly 210 and the main board assembly 220 can be transferred to the heat sink 320, and the heat sink 320 tends to evenly distribute the heat, which can assist in reducing temperatures of the coil assembly 210 and the main board assembly 220. The air flow with relatively low temperature entering the shell 100 through the first air port 121 can be guided by the fan 410, the air guide hood 420 and the air guide groove 423 formed by the fins 323, and then flow through the heat sink 320 to take away the heat of the heat sink 320 itself, so that the wireless charging device 10 can be cooled down. The arrangement of the air-blocking plate 124 can separate the second air port 122 from the first air port 121, which can prevent an air flow with relatively high temperature of the second air port 122 from entering the first air port 121. Depending on the power level of the fan 410, a heat storage material, or a heat insulation material, or a thermally conductive material can be provided on the surface of the second casing 110 to avoid an increase in the temperature of the device 20 to be charged or to well reduce the temperature of the device 20 to be charged.

The technical features of the above embodiments can be combined arbitrarily, and for the sake of concise description, not all possible combinations of the technical features of the above embodiments are described. However, as long as there is no contradiction in the combinations of these technical features, they should be considered as the scope of the specification.

The above embodiments only illustrate several embodiments of the present disclosure, and their descriptions are more specific and detailed, but they should not be understood as limiting the scope of the present disclosure. It should be noted that for those skilled in the art, several modifications and improvements can be made without departing from the concept of the present disclosure, which belong to the protection scope of the present disclosure. Therefore, the scope of protection of the present disclosure shall be subject to the appended claims.

What is claimed is:

1. A wireless charging device, comprising:
a shell, defined with a first air port and a second air port;
a coil assembly and a main board assembly, arranged in the shell; and
a heat dissipation assembly, configured to dissipate heat generated from the coil assembly and the main board assembly;
wherein the heat dissipation assembly comprises a heat sink and a fan, the heat sink comprises a first side and a second side facing away from each other, the coil assembly is arranged on the first side, the fan is arranged on the second side, and the fan is defined with a third air port and a fourth air port; and the first air port, the second air port, the third air port and the fourth air port are in communication with one another to form a heat-dissipation air passage located on the second side of the heat sink;
wherein the heat dissipation assembly further comprises an air guide hood, and the air guide hood is connected to the fan and configured to guide an air flow flowing out of the fan through the fourth air port to flow through the second side of the heat sink, and flow out of the shell through the second air port;
wherein the air guide hood comprises a connecting member and an air guide plate, an end of the connecting member is connected to an end of the fan where the fourth air port is defined, and the air guide plate is connected to another end of the connecting member.

2. The wireless charging device according to claim 1, wherein the connecting member comprises a top wall, a bottom wall and two side walls; the top wall, the bottom wall and the two side walls together define a through slot, the through slot is in communication with the fourth air port, and the air guide plate is connected to the bottom wall.

3. The wireless charging device according to claim 2, wherein an end of the air guide plate facing away from the fan is defined with a vent, and the vent is in communication with the second air port.

4. The wireless charging device according to claim 3, wherein the heat dissipation assembly further comprises at least two fins, the fins are arranged between the second side of the heat sink and the air guide plate, adjacent two of the fins define an air guide groove therebetween, and two ends of the air guide groove are respectively in communication with the through slot and the vent.

5. The wireless charging device according to claim 4, wherein the second side of the heat sink is disposed with an air guide wall extending obliquely relative to the air guide plate, the air guide wall is arranged corresponding to the vent and configured to guide an air flow flowing through the air guide groove to the vent and the second air port.

6. The wireless charging device according to claim 1, wherein the shell comprises a first casing and a second casing connected to the first casing, the second casing is configured to place a device to be charged, the first air port and the second air port are located on the first casing, the coil assembly, the main board assembly and the heat dissipation assembly are arranged in an accommodating space cooperatively defined by the first casing and the second casing.

7. The wireless charging device according to claim 6, further comprising an air-blocking plate; wherein the air-blocking plate protrudes from an outer surface of the first casing, and the air-blocking plate is located between the first air port and the second air port.

8. The wireless charging device according to claim 7, wherein the outer surface of the first casing is provided with support legs; and on a side of the first casing where the outer surface is located, a tail end of each of the support legs is flush with the air-blocking plate.

9. The wireless charging device according to claim 6, wherein the wireless charging device comprises reinforcement ribs arranged at the first air port and the second air port, and the reinforcement ribs are located on a side of the first casing where an inner surface of the first casing is located.

10. The wireless charging device according to claim 1, wherein the heat dissipation assembly comprises a heat-conducting element, and the heat-conducting element is fixed to the first side of the heat sink; at least part of the coil assembly is attached to the heat-conducting element, and the heat-conducting element is capable of absorbing heat of the coil assembly; and at least part of the main board assembly is attached to the heat-conducting element, and the heat-conducting element is capable of absorbing heat of the main board assembly.

11. The wireless charging device according to claim 10, wherein the first side of the heat sink is defined with a recess, and the heat-conducting element is received in the recess.

12. The wireless charging device according to claim 10, wherein the first side of the heat sink is provided with convex-ring segments, and the coil assembly is accommodated in an area surrounded by the convex-ring segments; an opening is defined on the main board assembly, and the convex-ring segments are located in the opening.

13. The wireless charging device according to claim 10, wherein the main board assembly comprises a heat source region, the heat source region is attached to the heat-conducting element, and the heat-conducting element is capable of absorbing heat of the heat source region.

14. The wireless charging device according to claim 13, wherein the heat source region and the fan are arranged facing away from each other on the heat sink.

15. A wireless charging device, comprising:
a shell, defined with a first air port and a second air port;
a coil assembly and a main board assembly, disposed in the shell, wherein the coil assembly and the main board assembly are electrically connected; and
a heat dissipation assembly, disposed in the shell and comprising a heat sink and a fan, wherein the coil assembly and the main board assembly are located at a same side of the heat sink, the fan is located on a side of the heat sink facing away from the coil assembly and electrically connected to the main board assembly, the side of the heat sink facing away from the coil assembly and the shell cooperatively define a passage therebetween, and the first air port is in communication with the second air port through the fan and the passage sequentially;
wherein the shell comprises a first casing and a second casing connected to the first casing, the second casing is configured to place a device to be charged, and the first air port and the second air port are located on a same outer surface of the first casing;
wherein the wireless charging device further comprises an air-blocking plate, the air-blocking plate protrudes from the outer surface of the first casing where the first air port and the second air port are located, and the air-blocking plate is located between the first air port and the second air port.

16. The wireless charging device according to claim 15, wherein the main board assembly is thermally connected to the heat sink, an opening is defined on the main board assembly, and the coil assembly is arranged in the opening and thermally connected to the heat sink.

17. The wireless charging device of claim 15, wherein the fan is defined with a third air port and a fourth air port, the first air port, the second air port, the third air port and the fourth air port are in communication with one another;
the heat dissipation assembly further comprises an air guide hood, and the air guide hood is connected to the fan and configured to guide an air flow flowing out of the fan through the fourth air port to flow through the passage, and flow out of the shell through the second air port;
the air guide hood comprises a connecting member and an air guide plate, an end of the connecting member is connected to an end of the fan where the fourth air port is defined, and the air guide plate is connected to another end of the connecting member.

18. A wireless charging device, comprising:
a shell, comprising a support surface for placing a device to be charged, wherein a side of the shell facing away from the support surface is defined with a first air port and a second air port;
a coil assembly and a main board assembly, disposed in the shell, wherein the coil assembly is electrically connected to the main board assembly; and
a heat dissipation assembly, disposed in the shell and comprising a heat sink and a fan, wherein the coil assembly and the main board assembly are arranged on a side of the heat sink facing towards the support surface, the coil assembly and the main board assembly are thermally connected to the heat sink, the fan is arranged on a side of the heat sink facing away from the coil assembly and electrically connected to the main board assembly, the side of the heat sink facing away from the coil assembly and the shell form a passage therebetween, the first air port is in communication with the second air port through the fan and the passage sequentially;
wherein the heat dissipation assembly further comprises an air guide hood and a heat-conducting element, the air guide hood is arranged in the passage and connected to the fan, and the air guide hood is configured to guide a flow of a heat-dissipation air flow; the heat-conducting element is connected to the heat sink, the main board assembly is attached to the heat-conducting element, an opening is defined on the main board assembly, and the coil assembly is arranged in the opening and attached to the heat-conducting element.

19. The wireless charging device of claim 18, wherein the fan is defined with a third air port and a fourth air port; and the first air port, the second air port, the third air port and the fourth air port are in communication with one another;
wherein the air guide hood is configured to guide the flow of the heat-dissipation air flow flowing out of the fan through the fourth air port to flow through the side of the heat sink facing away from the coil assembly, and flow out of the shell through the second air port;
wherein the air guide hood comprises a connecting member and an air guide plate, an end of the connecting member is connected to an end of the fan where the fourth air port is defined, and the air guide plate is connected to another end of the connecting member.

20. The wireless charging device of claim 18, wherein the shell comprises a first casing and a second casing connected to the first casing, the second casing is configured to place the device to be charged, and the first air port and the second air port are located on a same outer surface of the first casing;
wherein the wireless charging device further comprises an air-blocking plate, the air-blocking plate protrudes from the outer surface of the first casing where the first air port and the second air port are located, and the air-blocking plate is located between the first air port and the second air port.

\* \* \* \* \*